(12) United States Patent
Lauderdale et al.

(10) Patent No.: US 11,054,451 B2
(45) Date of Patent: Jul. 6, 2021

(54) ELECTROSTATIC DISCHARGE MEASURING DEVICE

(71) Applicant: NXP USA, Inc., Austin, TX (US)

(72) Inventors: Matthew Clay Lauderdale, Austin, TX (US); Robert Scott Ruth, Kittredge, CO (US); Emmanuel U. Onyegam, Austin, TX (US)

(73) Assignee: NXP USA, Inc., Austin, TX (US)

( * ) Notice: Subject to any disclaimer, the term of this patent is extended or adjusted under 35 U.S.C. 154(b) by 253 days.

(21) Appl. No.: 16/365,415

(22) Filed: Mar. 26, 2019

(65) Prior Publication Data

US 2020/0309834 A1 Oct. 1, 2020

(51) Int. Cl.
*G01R 29/08* (2006.01)
*G01R 29/12* (2006.01)
*H02H 1/00* (2006.01)

(52) U.S. Cl.
CPC ......... *G01R 29/0814* (2013.01); *G01R 29/12* (2013.01); *H02H 1/0007* (2013.01)

(58) Field of Classification Search
CPC .. G01R 1/00; H02H 1/00; H01L 21/00; H01L 2221/00; H02J 1/00
See application file for complete search history.

(56) References Cited

U.S. PATENT DOCUMENTS

| 9,629,294 | B2 | 4/2017 | Kunz, Jr. et al. |
| 9,673,116 | B2 | 6/2017 | DeForge et al. |
| 2014/0327079 | A1 | 11/2014 | Etherton et al. |
| 2015/0214730 | A1* | 7/2015 | Chuang ............... H01L 27/0277 361/56 |
| 2016/0043538 | A1* | 2/2016 | Hung .................... H02H 9/046 361/33 |
| 2016/0126729 | A1 | 5/2016 | Gerdemann et al. |
| 2017/0302066 | A1* | 10/2017 | Gao ........................ H03K 5/08 |
| 2017/0346280 | A1* | 11/2017 | Stockinger ......... G01R 31/2856 |
| 2018/0019741 | A1* | 1/2018 | Huang ............... H03K 17/0822 |
| 2018/0088163 | A1 | 3/2018 | Chang et al. |
| 2018/0114556 | A1* | 4/2018 | Buchanan ................ G11C 7/24 |
| 2018/0143233 | A1 | 5/2018 | Graf et al. |
| 2018/0172748 | A1 | 6/2018 | Tung et al. |

OTHER PUBLICATIONS

Wes Lukaszek, "Use of EEPROM-based Sensors in Investigating Physical Mechanisms Responsible for Charging Damage", Apr. 30, 2002.

\* cited by examiner

*Primary Examiner* — Jermele M Hollington
*Assistant Examiner* — Temilade S Rhodes-Vivour

(57) ABSTRACT

An electrostatic discharge measuring device includes an integrated circuit including a collector, a discharge pad and an ESD detector circuit coupled to the collector and discharge pad. The ESD detector circuit includes a device that detects occurrence and magnitude of an electrostatic discharge between the collector and the discharge pad. In one embodiment, the device is a metal-oxide-semiconductor capacitor. In another embodiment, the device is a thin film storage bitcell. In one embodiment, the electrostatic discharge measuring device is contained in a test microelectronic package. A method includes running the test microelectronic package through a manufacturing process to determine location during manufacturing at which an electrostatic discharge occurs when an externally-similar production microelectronic packages is run through the same manufacturing process.

19 Claims, 10 Drawing Sheets

# ELECTROSTATIC DISCHARGE MEASURING DEVICE

BACKGROUND

Field

This invention relates generally to integrated circuits, and more specifically to a device for measuring an electrostatic discharge.

Related Art

During handling and processing, a packaged integrated circuit can inadvertently become charged by field induction or triboelectric means. When a lead of such an integrated circuit comes into contact with a conductor at a different potential a very rapid electrostatic discharge event may occur.

An electronic device of an integrated circuit may be damaged by an electrostatic discharge during manufacturing and/or testing of the integrated circuit. A charged-device model (CDM) of an electrostatic discharge is used for characterizing susceptibility of an electronic device to damage from an electrostatic discharge that may occur by a rapid metal-to-metal discharge such as a discharge between a lead of an integrated circuit and a portion of a machine used for manufacturing and/or testing the integrated circuit. A charged-device model type of electrostatic discharge typically lasts approximately 1 nanosecond (ns) and can produce instantaneous currents up to approximately 20 amperes (A). Such high current events can easily generate gate oxide damaging voltages. A human-body model (HBM) of an electrostatic discharge is used for characterizing susceptibility of an electronic device to damage from electrostatic discharge that may occur when a human touches the electronic device. A human-body model type of electrostatic discharge typically lasts longer than the charged-device model type, and the human-body model type typically produces lower instantaneous currents than the charged-device model type. The charged-device model type of electrostatic discharge is a common cause of electrostatic discharge damage that occurs to electronic devices during manufacturing and/or testing of electronic devices.

Non-volatile electronic memory devices comprising a floating gate memory cell, a split gate memory cell, and thin film storage flash technology that use silicon nanocrystals as conductive islands in a nonconductive layer of silicon oxide nanocrystals are well known. Thin film storage flash technology can be programmed and erased many times and will retain their last state nearly indefinitely. Normal flash erase times are much longer than the 1 ns typical of a charged-device model pulse.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As fabrication process of integrated circuits becomes smaller, integrated circuits become more sensitive to ESD events. New wafer technologies and integrated circuit designs are increasingly susceptible to damage from smaller electrostatic discharge events, perhaps as small as 200V.

Figure 1:
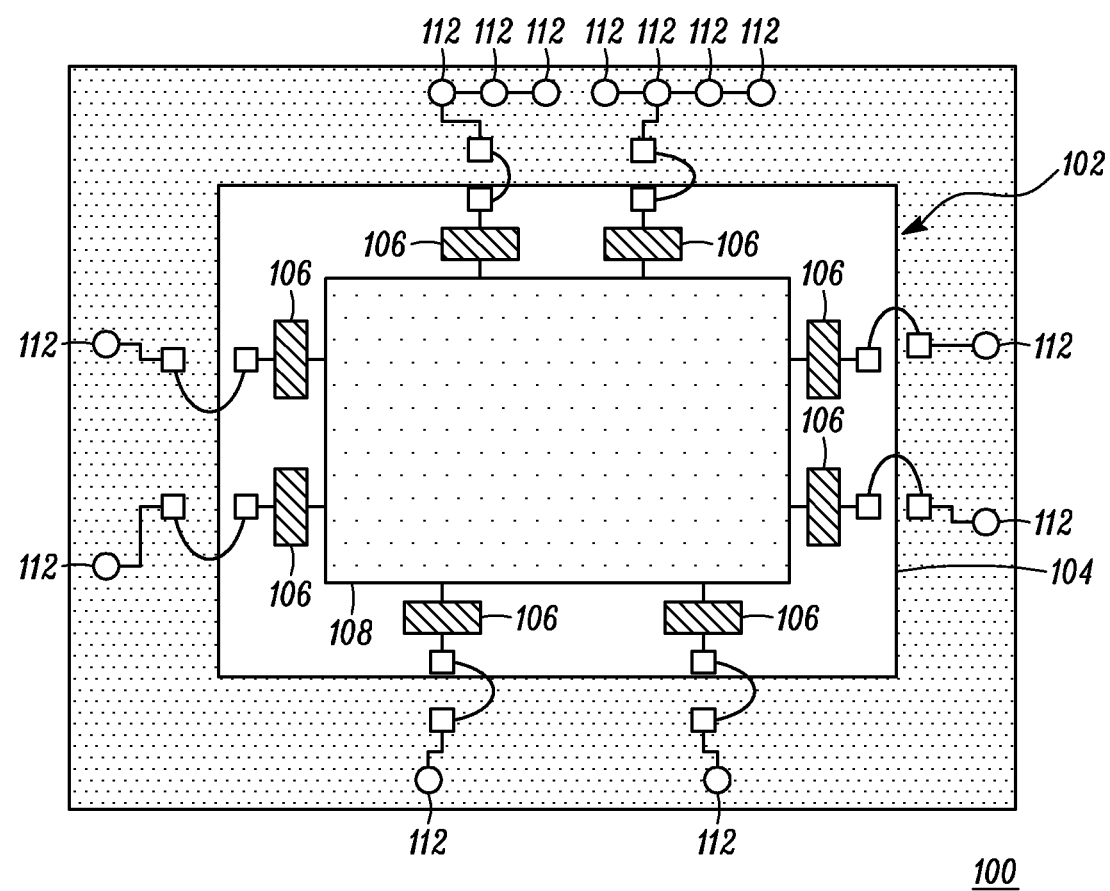
FIG. 1 is a simplified representation of a test microelectronic package including a plurality of ESD detector circuits in accordance with one embodiment of the invention.

FIG. 1 is a simplified representation of a test microelectronic package 100 (hereinafter "test package") in accordance with one embodiment of the invention. In one embodiment, the test package 100 is a dual in-line package, or a flat-pack no-lead package such as a dual flat-pack no-lead (DFN) package or a quad, flat-pack no-lead (QFN) package (hereinafter "QFN-style package"). Examples of QFN-style packages are: a power quad flat-pack no-lead (PQFN) package, an extremely-thin quad flat-pack no-lead (XQFN) package, a depopulated very-thin quad flat-pack no-lead (DQFN) package, and a heatsink very-thin quad flat-pack no-lead (HVQFN) package. The test package 100 can be other types of packages, such as a ball grid array (BGA) package, a flip-chip BGA package, a mold-array process ball grid array (MAPBGA) package and a plastic ball grid array (PBGA) package.

An electrostatic discharge (ESD) measuring device 102 in accordance with the invention comprises an integrated circuit 104 disposed on a circuit-supporting substrate. In one embodiment, the circuit-supporting substrate is silicon. In another embodiment, the circuit supporting substrate is germanium, gallium arsenide (GaAs), other semiconducting materials or insulating substrates such as silicon dioxide, aluminum oxide or sapphire. The integrated circuit 104 includes at least one ESD detector circuit 106 (hereinafter "detector circuit") and a collector 108. In one embodiment, the detector circuit 106 comprises CMOS devices. In other embodiments, the detector circuit 106 comprises NMOS devices, PMOS devices, bipolar devices and/or GaN devices. In one embodiment, the integrated circuit 104 is housed within the test package 100. The test package 100 includes a plurality of discharge pads 112. In one embodiment, the plurality of discharge pads 112 are located around a periphery of the test package because the periphery of package is the most likely portion of the test package that may contact a metallic portion of a machine used for manufacturing and/or testing the integrated circuit.

Test packages 100 are run through production machinery in place of production products during equipment and package level process evaluations. The ESD measuring device 102 detects occurrence of a charged-device model (CDM) type of ESD event, measures magnitude of the ESD event and stores the magnitude in a memory that is readable by a normal test process. In some embodiments, to more accurately assess ESD risk during processing events, the test package 100 has a same size, shape and external construction material of a production microelectronic package (not shown). The test package 100 can be run through any production process and measured at a later time.

In one embodiment, the ESD measuring device 102 has a plurality of detector circuits 106 each of which is coupled to one or more of the discharge pads 112 of the test package 100. For simplicity of illustration, FIG. 1 shows eight (8) detector circuits 106 in the test package 100; however, in other embodiments the test package has twelve (12) or more detector circuits. If an ESD event occurs on discharge pads 112 the detector circuit 106 that is coupled to the discharge pads 112 measures and records the ESD event. The location within production machinery of occurrence of an ESD event on the test package 100 can be distinguished by determining which detector circuit 106 is affected.

The collector 108 collects charge and/or couples with external electric fields. The collector 108 occupies a large portion of the center of the integrated circuit 104. The collector 108 comprises a large electrically conductive network. In one embodiment, the collector comprises 108 a near maximum density arrangement of all metals and vias to contact and active portions of the substrate. The collector 108 may be designed to have a specific amount of capacitance which will affect peak discharge current with respect to the charge voltage. This capacitance is discharged when a discharge pad 112 is grounded. To maximize the capacitance of the collector 108, as much conductive material as possible is used for the collector. In one embodiment, maximum density metal grids are printed in all metal layers. They are connected together with a maximum density via configuration. Additionally, the collector 108 has contacts to a normally doped P substrate.

When the ESD measuring device 102 is subjected to a large electro-magnetic field (EMF), a positive or a negative charge, depending on the environment of the test package 100, accumulates on the collector 108. If one of the discharge pads 112 of the test package 100 contacts an object at a higher or lower potential than the collector 108 an ESD event occurs. During the ESD event, charge flows from the collector 108 to the discharge pad 112 or vice versa. The ESD event modifies the ESD measuring device 102 in a way that can be measured. The test package 100 includes measure pads 214 (see FIG. 2) so that the ESD measuring device 102 can be measured and in some cases be reset with a tester.

An ESD event on any discharge pad 112 affects only the detector circuit 106 to which the discharge pad is connected. An approximate location on the test package 100 at which an ESD event occurred can be determined by measuring the detector circuit 106 that is coupled to the one or more discharge pads 112 at the location. This spatial information is useful to identify process issues.

Figure 2:
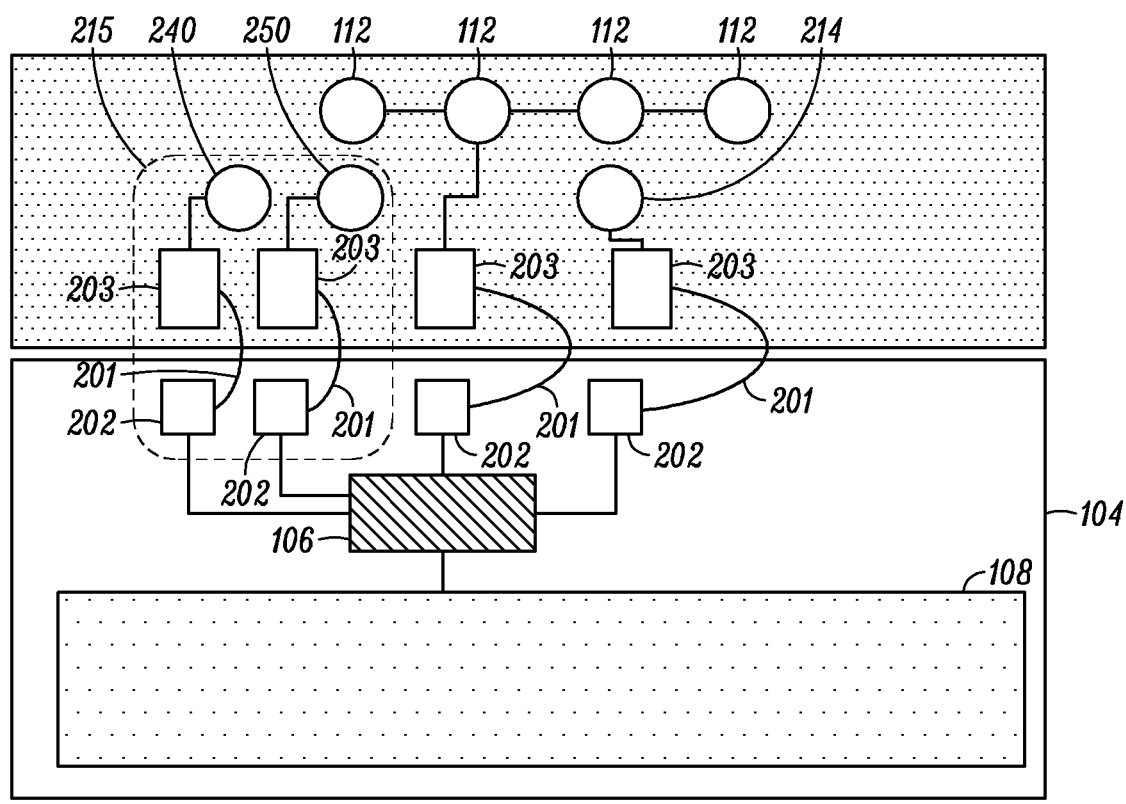
FIG. 2 is a more detailed representation of a portion of the test microelectronic package shown in FIG. 1.

FIG. 2 is a more detailed representation of a portion of the test package 100. The test package 100 includes a measure pad 214 coupled to the detector circuit 106. In some embodiments, the test package 100 includes additional control pads 215, such as a drain pad 240 and a source pad 250, coupled to the detector circuit 106. There are electrical connections between the die 108 and pins/balls/spheres of the package 100. FIG. 2 shows wire bonds 201 connecting each terminal 202 on the integrated circuit 104 with an associated bond finger 203 on a package side of the wire bond. Each bond finger 203 is connected to the discharge pad 112, measure pad 214, and the other control pads 215 on the package 100. In some embodiments, such as with a BGA package, the measure pads 214 and the other control pads 215 are located away from the periphery of the test package 100. In other embodiments, electrical connections between the detector circuit 106 and the package 100 can be made by solder spheres, copper pillars or other interconnect methods.

If an ESD event occurs on a discharge pad 112, it is measured by the detector circuit 106 that is coupled to the discharge pad. In some embodiments, multiple discharge pads 112 are connected to a single detector circuit 106. This allows coverage of a large number of at-risk external leads with a smaller number of detector circuits 106.

In some embodiments, the test package 100 includes an external lead coupled to each of measure pad 214, the drain pad 240 and the source pad 250. These external leads allow the ESD measuring device 102 to be measured and reset for its next use. Functionality of the test package 100 can be verified through the measure pad 214, the drain pad 240 and the source pad 250. Advantageously, ESD events on the measure pad 214, the drain pad 240 and the source pad 250 do not affect the detector circuit 106.

Figure 3:
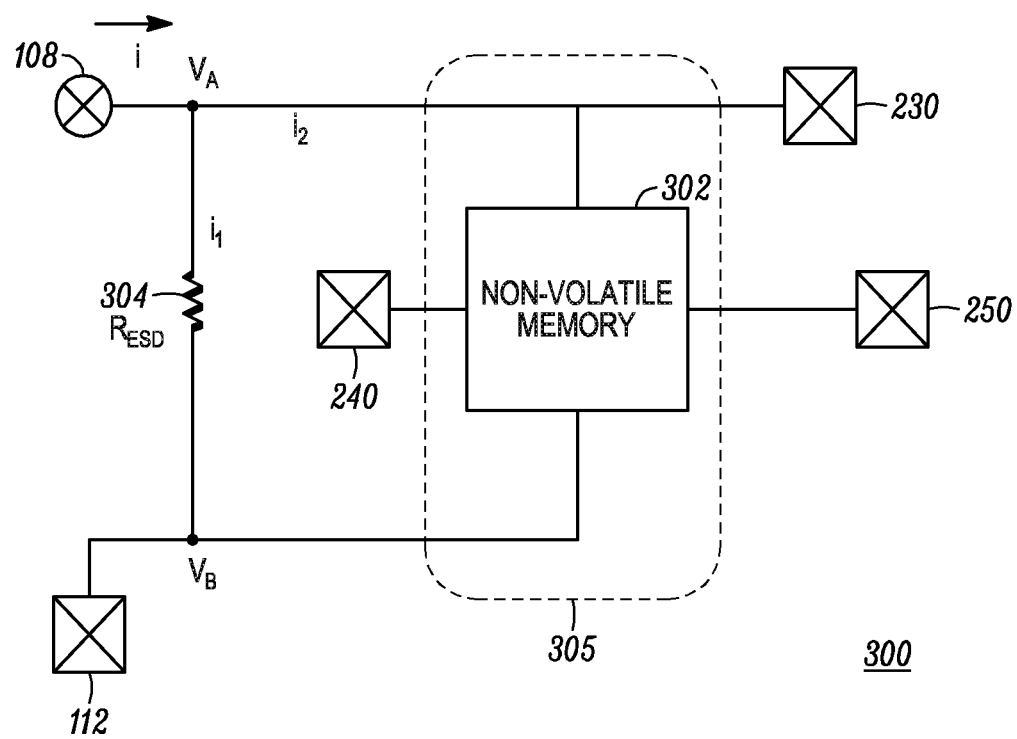
FIG. 3 is a schematic of a basic ESD detector circuit that can be used as the ESD detector circuit shown as a block in FIG. 2.

FIG. 3 is a schematic of a basic detector circuit 300 that can be used as the detector circuit 106 shown as a block in FIG. 2. The basic detector circuit 300 functions over a wide range of ESD event voltages.

Each detector circuit 300 includes an ESD detector 302 (hereinafter "detector") coupled in a parallel configuration with a low resistance path $R_{ESD}$ 304. The $R_{ESD}$ 304 is coupled between the collector 108 and a discharge pad 112. In one embodiment, the low resistance path $R_{ESD}$ 304 consists of a single low resistance resistor. By "low resistance", it is meant a few 10's of ohms or less. The low resistance path $R_{ESD}$ 304 diverts current due to an ESD event through it. The $R_{ESD}$ 304 is a primary current path for the current due to an ESD event.

The detector 302 comprises a non-volatile memory ("NVM") device. The NVM device produces a predictable, measurable channel conductivity change that correlates to a field voltage of an ESD event. A gate of the NVM device is connected to the collector 108. A body of the NVM device is connected to a discharge pad 112. The discharge pad 112 is coupled to an external contact such as a sphere of a BGA package, a lead, a bond pad or other connection to the outside world. When an ESD discharge occurs through the discharge pad, a large instantaneous current flows between the collector 108 and the discharge pad 112. Current flows through $R_{ESD}$ 304 thereby generating a voltage potential $V_A$-$V_B$ across the NVM device. If $V_A$-$V_B$ is within an analog response range of the NVM device, a threshold voltage ($V_T$) shift occurs. Sensitivity of the NVM device to current through the primary current path is controlled by a resistance value of $R_{ESD}$ 304. The measure pad 214 is coupled to a gate of the NVM device. The drain pad 240 is coupled to a drain of the NVM device. A source pad 250 is coupled to a source of the NVM device.

Several types of NVM device can be used as the NVM device. In one embodiment, the NVM comprises a thin film storage (TFS) bitcell. In such embodiment, the ESD measuring device 102 may advantageously be reset and reused. The measure pad 214, the drain pad 240, the source pad 250 and a body connection are used to program and erase the TFS bitcell. In one such embodiment, during an ESD event, current through $R_{ESD}$ 304 generates sufficient voltage to at least partially erase the pre-programmed TFS bitcell. In another embodiment, current through $R_{ESD}$ 304 generates sufficient voltage to at least partially program an erased TFS bitcell. Event sensitivity is adjusted by changing $R_{ESD}$ 304. When contact is made to the discharge pad 112, most of the charge ($i_1$) passes through $R_{ESD}$ 304, which is a robust primary ESD path capable of carrying many amperes of current. The low resistance path $R_{ESD}$ 304 is capable of carrying the current generated by the largest ESD event within the analog response range of the detector circuit. In one embodiment, the low resistance path $R_{ESD}$ 304 is capable of carrying 20 A. The low resistance path $R_{ESD}$ 304 creates a voltage potential $V_A$-$V_B$ capable of inducing Fowler-Nordheim (FN) tunneling within the TFS bitcell. Current through a much higher impedance path ($i_2$) is negligible. In one embodiment, electrostatic discharge events of interest produce $V_A$-$V_B$ potentials between 20V and 35V. Selection of a resistance value of $R_{ESD}$ 304 determines which ESD currents map to this range. $R_{ESD}$ 304 also controls a minimum resolution between distinguishably different ESD event magnitudes.

If an ESD event occurs, the ESD event shifts the $V_T$ of the TFS bitcell by FN tunneling. This shift slightly erases the TFS bitcell. An amount of the shift is proportional to the magnitude of the ESD event. More specifically, the amount of the shift is nonlinearly dependent on the magnitude of the ESD event.

A potential difference produced by $R_{ESD}$ 304 is used to disrupt charge trapped in the TFS bitcell. The $V_T$ of the TFS bitcell shifts predictably in response to the peak voltage of a 1 ns pulse between 20V and 35V. The TFS bitcell then maintains a $V_T$ shift that can be detected with a tester at a later time.

Other devices that can be used as the NVM device of the detector circuit 300 include split gate flash (SGF), magnetoresistive random access memory (MRAM) and floating gate (FG).

Figure 4:
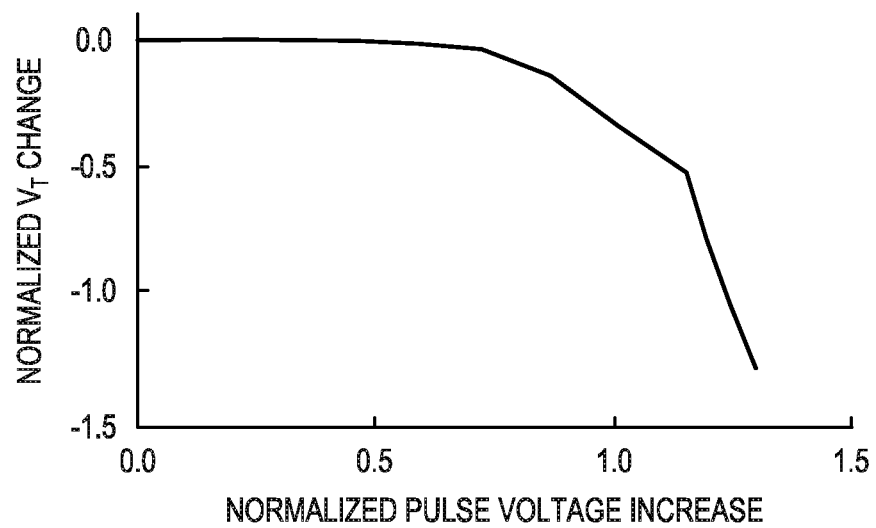
FIG. 4 is a graph of a response of a thin film storage bitcell to a 1 ns charge device model type of voltage pulse events.

The inventors have investigated the response of programmed TFS bitcells to 1 ns erase pulses. FIG. 4 is a graph of a predictable response of a programmed TFS bitcell to 1 ns CDM type of voltage pulse events. Pulses below 20V with less than 10 ns durations have no significant effect on the TFS bitcell. Pulses greater than 35V of any duration completely erased the TFS bitcell. For a 1 ns pulse, between 20V and 32V the current change ratio of the TFS bitcell has a geometric response to the pulse voltage. This means that the TFS bitcell a can be used as an analog CDM event gauge.

The graph shows $V_T$ shift with respect to peak voltage of a 1 ns pulse. As the voltage of pulses increases, the $V_T$ observed for a TFS bitcell decreases in a predictable and measurable way. Pulse voltage change is normalized to the voltage typically used to erase a TFS bitcell with the formula $$V_{normalized} = (V_{pulse} - V_{typical\_erase\_event})/V_{typical\_erase\_event}.$$

The $V_T$ change is normalized to a fully programmed $V_T$ with the formula $$V_{Tnormalized} = (V_{Tmeasured} - V_{Tprogrammed})/V_{Tprogrammed}.$$

The response shows that a TFS bitcell is well suited to measure 1 ns pulse events typical of CDM events. A TFS bitcell is used directly to measure the energy of very short voltage pulses. Therefore, coupled with a small resistor, a TFS bitcell is useful to measure the energy of a very short current pulse. The $V_T$ of a programmed TFS bitcell is on the order of 3V. The $V_T$ of a non-programmed, or erased, TFS bitcell is on the order of −1.5V. The $V_T$ of a partially programmed TFS bitcell is anywhere between −1.5V and 3V. A relationship between the $V_T$ shift and the magnitude of an ESD event is controlled by $R_{ESD}$ to any value. A smallest detectable ESD event within the analog response range of the detector circuit would cause a $V_T$ shift of approximately 10%. For example, the smallest detectable ESD event would cause a $V_T$ shift from approximately 1.8V to approximately 1.6V, or −0.2V. A largest detectable ESD event within the analog response range of the detector circuit would cause a $V_T$ shift to approximately −0.5V.

Figure 5:
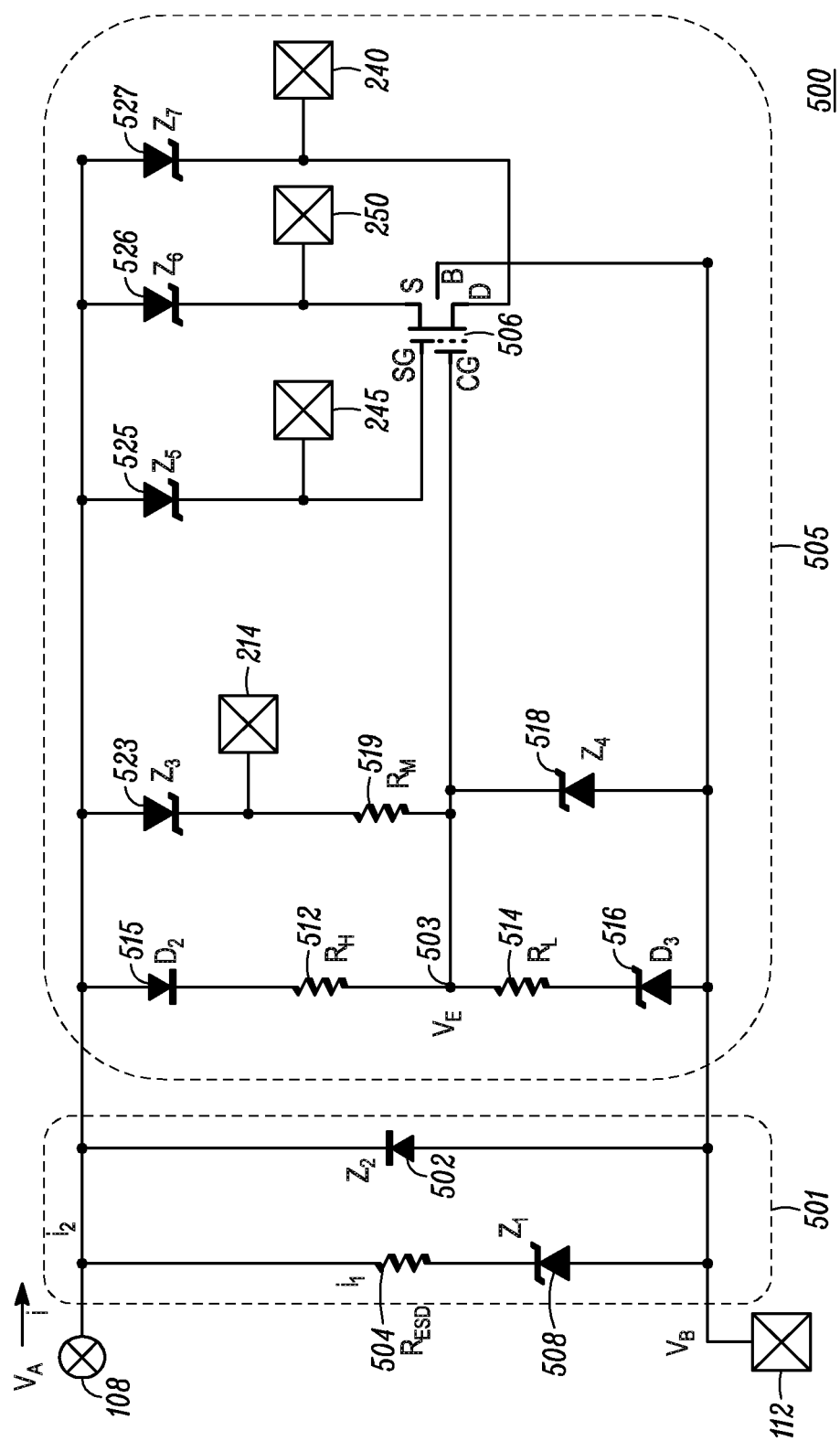
FIG. 5 is a schematic of an advanced ESD detector circuit that can be used as the ESD detector circuit shown as a block in FIG. 2.

FIG. 5 is a schematic of an advanced detector circuit 500 that can be used as the detector circuit 106 shown as a block in FIG. 2. The advanced detector circuit 500 has additional features over the basic detector circuit 300 to improve performance. The low resistance path $R_{ESD}$ 304 consisting of only a single resistor in the detector circuit 300 has additional components in the advanced detector circuit 500. In FIG. 5, the low resistance path is indicated as advanced $R_{ESD}$ 501.

The advanced detector circuit 500 uses TFS bitcell 506 as the detector. The TFS bitcell 506 has a body connected to the discharge pad 112, a drain terminal coupled to the drain pad 240, a source terminal coupled to a source pad 250, a select gate terminal coupled to a select gate pad 245 and a control gate terminal coupled to a node 503. The advanced $R_{ESD}$ 501 includes a diode $Z_2$ 502 in parallel with a $R_{ESD}$ 504 that provides a near zero resistance path for current flowing from the discharge pad 112 to the collector 108. The advanced detector circuit 500 utilizes a voltage divider comprising $R_H$ 512 and $R_L$ 514 to convert voltage $V_A$ generated by $R_{ESD}$ 504 during an ESD event into a voltage $V_E$ at node 503. The diode $Z_2$ 502 allows reverse current events to bypass $R_{ESD}$ 504 and not affect the TFS bitcell 506. The advanced $R_{ESD}$ 501 includes a voltage regulator $Z_1$ 508 in series with $R_{ESD}$ 504. The voltage regulator $Z_1$ 508 aids in detecting small ESD events by creating a large voltage with little current. The voltage regulator $Z_1$ 508 acts as an open circuit for small potentials. Voltage across $Z_1$ 508 increases rapidly for small current increases until a specified voltage is reached. Above its turn-on voltage, $Z_1$ 508 acts as a short which allows $R_{ESD}$ 504 to dictate additional voltage rise in proportion to current increase. The result is a voltage $V_E$ that quickly rises into the analog response range of the TFS bitcell 506 then follows a slower rise. The slower increase rate within the dynamic range increases the range of measurable ESD events.

Dotted-line area 305 in FIG. 3 corresponds approximately to dotted-line area 505 in FIG. 5. The detector circuit 500 includes the following components that enhance operation and performance of the detector circuit. A diode $D_2$ 515 in series with resistors $R_H$ 512 and $R_L$ 514 and voltage regulator $D_3$ 516 works with $R_{ESD}$ 504 to fine tune a relationship between a $R_{ESD}$ current and an erase voltage of the TFS bitcell 506. This resistor divider ultimately controls the sensitivity of the TFS bitcell 506. By preventing reverse currents from flowing through the resistor divider $R_H$ 512 and $R_L$ 514, diode $D_2$ 515 prevents a build-up of $V_E$ at node 503 and ensures that reverse polarity events do not affect the TFS bitcell 506. The voltage regulator $D_3$ 516 blocks forward current for voltages below a minimum of the measure, program and erase voltages of the TFS bitcell 506, thereby allowing the TFS bitcell to be measured programmed and erased with very low currents from a tester. A voltage regulator $Z_4$ 518 protects the TFS bitcell 506 from over voltage damage. The voltage regulator $Z_4$ 518 becomes a short above its threshold voltage preventing additional current from flowing through $R_L$ 514 and thus limiting $V_E$, thereby protecting the TFS bitcell 506 from over voltage.

The measure pad 214 provides direct access to a control gate of the TFS bitcell 506 for read, write and erase purposes. The measure pad 214 is connected to the control gate of the TFS bitcell 506 through a large resistance resistor $R_M$ 519. $R_M$ 519 ensures that any 1 ns voltage event on the measure pad 214 does not inadvertently alter the $V_T$ of the TFS bitcell 506. Control gate (CG) voltage accuracy is critical during read, write and erase events. Therefore, the CG voltage may be provided by a precision voltage source instrument. To reduce instrument current requirements, the voltage regulator $D_3$ 516 is used to build voltage quickly with very low currents between the measure pad 214 and the discharge pad 112. A turn-on threshold of the voltage regulator $D_3$ 516 is generally just above a voltage required to erase the TFS bitcell within 10-100 ms. Diode $D_2$ 515 prevents the relatively low resistance path of the advanced $R_{ESD}$ 501 from becoming an alternate path for current from the measure pad 214 to the discharge pad 112.

Voltage regulators $Z_3$ 523, $Z_5$ 525, $Z_6$ 526 and $Z_7$ 527 prevent ESD discharges on the measure pad 214, select gate pad 245, source pad 250 and drain pad 240, respectively, from influencing the TFS bitcell 506 or damaging the detector circuit 500.

All voltage regulators in the detector circuit are shown as Zener diodes but other devices can be used. Snap back devices with body and gate shorted to ground can be used instead of one or more of the Zener diodes. A snap back device in the ESD path increases the sensitivity of the detector circuit 500 to small ESD events. After detecting and measuring a first ESD event, the TFS bitcell 506 can be re-programmed and the detector circuit 500 can be re-used multiple times to detect and measure other ESD events.

Figure 6:
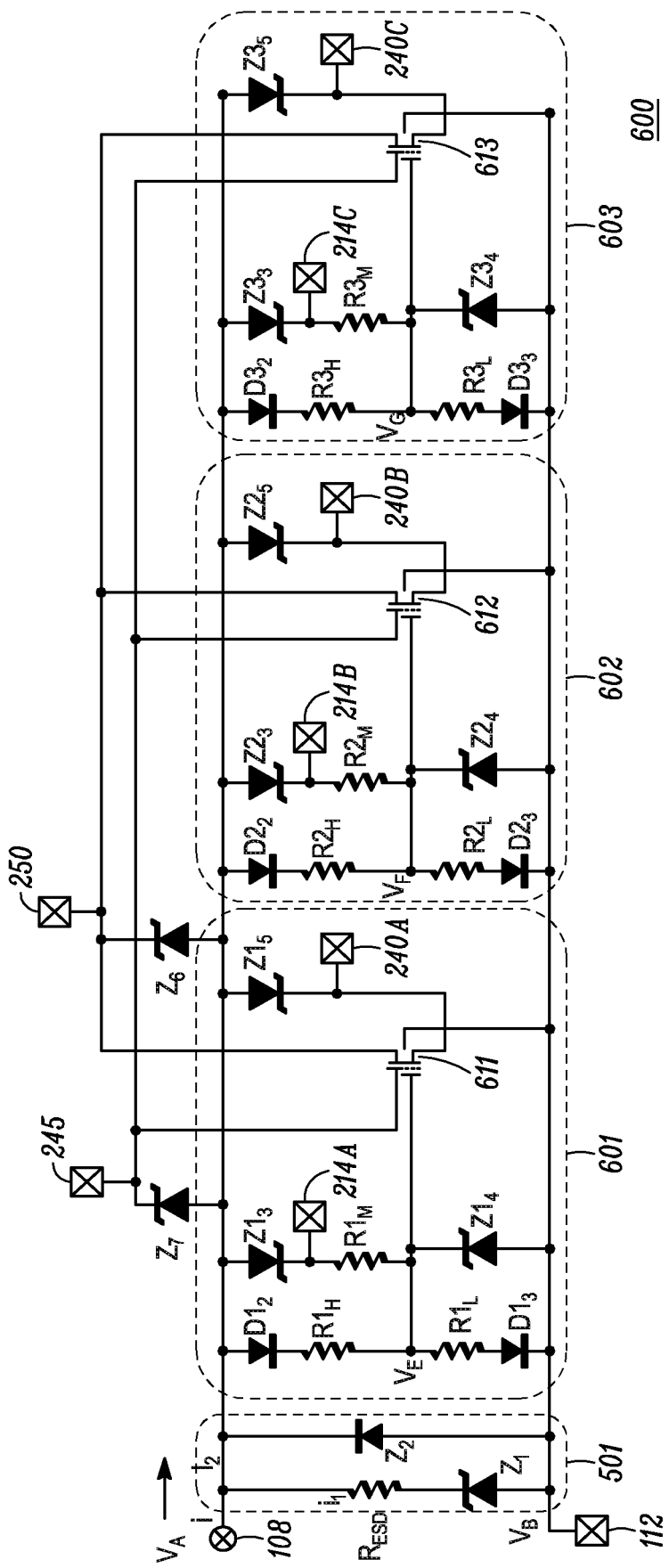
FIG. 6 is a schematic of a three-stage ESD detector circuit that can be used as the ESD detector circuit shown as a block in FIG. 2.

FIG. 6 is a schematic of a three-stage detector circuit 600 that can be used as the detector circuit 106 shown as a block in FIG. 2. Multiple detector circuits can be placed in parallel to a single ESD path. The detector circuit 600 includes three instances 601, 602 and 603 of the advanced detector circuit 500; therefore a detailed description of each advanced detector circuit of detector circuit 600 will not be repeated here. The detector circuit 600 has improved voltage range coverage compared to advanced detector circuit 500.

The three-stage detector circuit 600 includes TFS bitcell 601, TFS bitcell 602 and TFS bitcell 603. In one embodiment, TFS bitcell 601 is a 100V detector, TFS bitcell 602 is a 300V detector, and TFS bitcell 603 is a 600V detector. To conserve I/O resources the select gates for all TFS bitcells are tied to a common SG Pad 245. The sources also share a common source pad 250. Measure pad 214A is coupled to the control gate of TFS bitcell 611, measure pad 214B is coupled to the control gate of TFS bitcell 612 and measure pad 214C is coupled to the control gate of TFS bitcell 613. Drain pad 240A is coupled to the drain of TFS bitcell 611, drain pad 240B is coupled to the drain of TFS bitcell 612 and drain pad 240C is coupled to the drain gate of TFS bitcell 613. The resistor dividers within each advanced detector circuit are tuned differently. Each advanced detector circuit of detector circuit 600 provides a different portion of $V_A$-$V_B$ across its TFS bitcell. The detector circuits of detector circuit 600 are designed such that, as current as a result of an ESD increases TFS bitcell 602 enters its analog response range as TFS bitcell 601 reaches its maximum voltage. As the current as a result of an ESD increases further TFS bitcell 603 enters its analog response range as TFS bitcell 602 reaches its maximum voltage.

Each of the RH and RL pairs are used to tune each detector circuit of the three-stage detector circuit 600 to respond to a specific range of ESD event magnitudes. For simplicity, $V_B$=0. The detector circuit 600 utilizes three voltage dividers to convert $V_A$ generated by $R_{ESD}$ during an ESD event into three different voltages ($V_E$, $V_F$ and $V_G$) for three different TFS bitcells. As $V_A$ increases, $V_E$ quickly affects the 100V TFS bitcell 601 but not the other bitcells. As current increase further, the 100V TFS bitcell 601 saturates and $V_F$ starts to affect the 300V TFS bitcell 602. As the 300V TFS bitcell 602 saturates, the 600V TFS bitcell 603 becomes affected. As a result, detector circuit 600 can resolve ESD currents, with good discrimination, from near zero up to 12 A. Simulations of this response are shown in FIG. 7.

Figure 7:
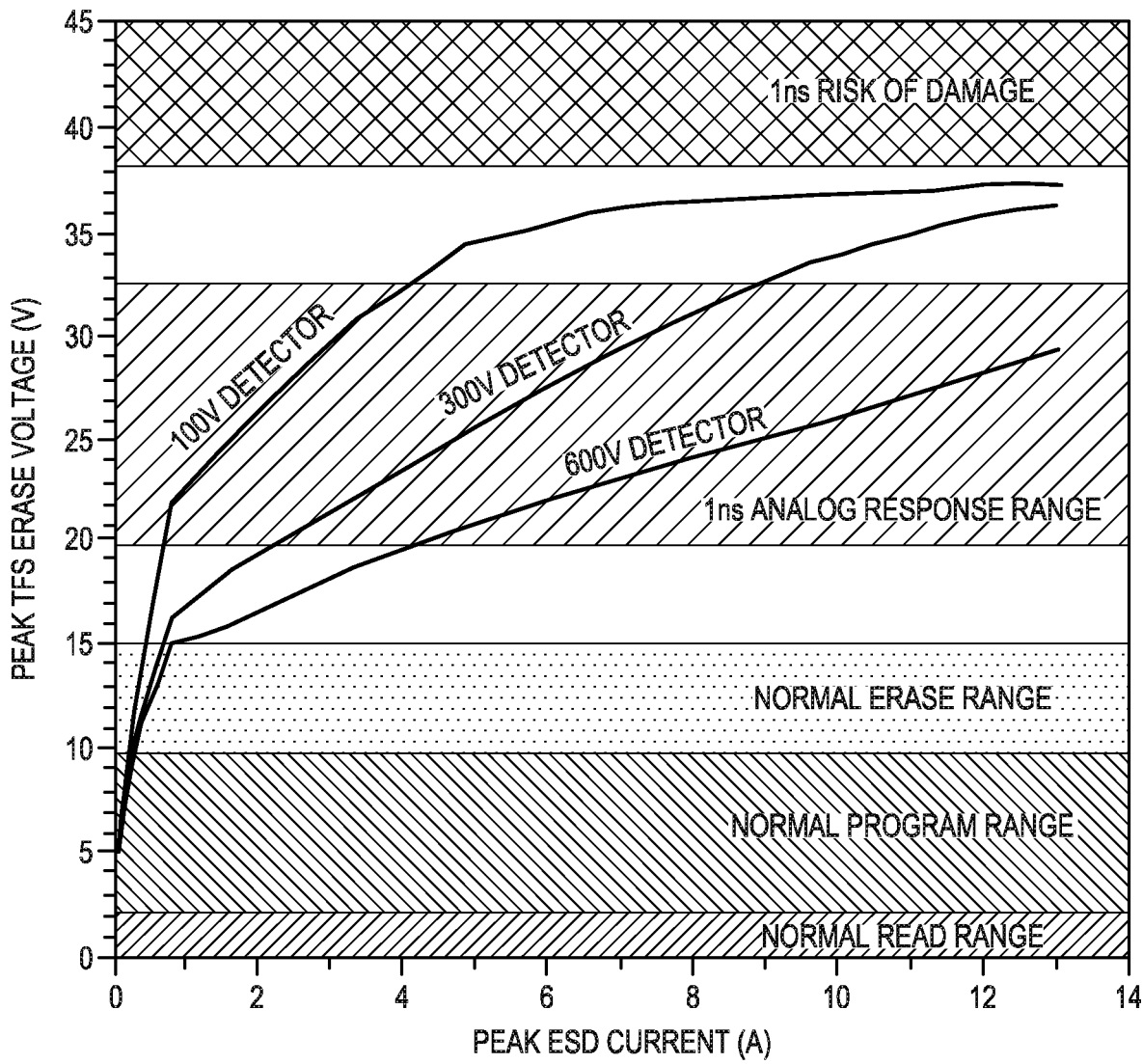
FIG. 7 is a graph of peak voltage experienced by each NVM device within the three-stage embodiment of one ESD detector circuit shown in FIG. 6.

FIG. 7 is a graph of peak voltage experienced by each NVM device within the three-stage detector circuit 600.

Figure 8:
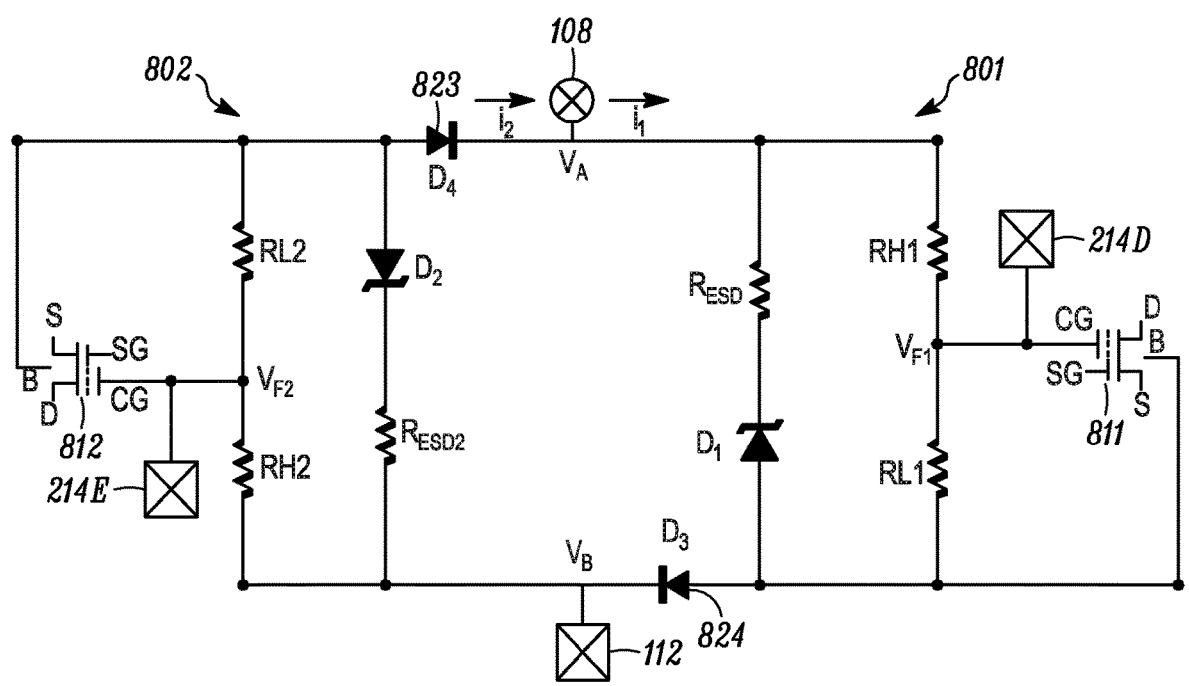
FIG. 8 is a schematic of a bi-directional ESD detector circuit that can be used as the detector circuit shown as a block in FIG. 2.

FIG. 8 is a schematic of a bi-directional detector circuit 800 that can be used as the detector circuit 106 shown as a block in FIG. 2. Detector circuit 800 comprises detector sub-circuit 801 and detector sub-circuit 802. Detector sub-circuit 801 includes TFS bitcell 811 and detector sub-circuit 802 includes TFS bitcell 812. Current flowing from the collector 108 to discharge pad 112 can only flow through sub-circuit 801 because diode 823 prevents this current from flowing through sub-circuit 802. Current flowing from discharge pad 112 to the collector 108 can only flow through sub-circuit 802 because diode 824 prevents this current from flowing through sub-circuit 801. Measure pad 214D is coupled to the control gate of TFS bitcell 811, and measure pad 214E is coupled to the control gate of TFS bitcell 812. Detector circuit 800 includes two drain pads and two source pads; however, for simplicity of illustration, the drain pads and source pads are not shown in FIG. 8. Depending on a polarity of an ESD event at the discharge pad 112, the $V_T$ of only one of TFS bitcell 811 and TFS bitcell 812 is shifted in proportion to a magnitude of the ESD event. A ratio of the $V_T$ change in TFS bitcell 811 to the $V_T$ change in TFS bitcell 812 indicates a direction of ESD current flow. A magnitude of a largest of the two $V_T$ changes indicates a magnitude of the ESD event.

Figure 9:
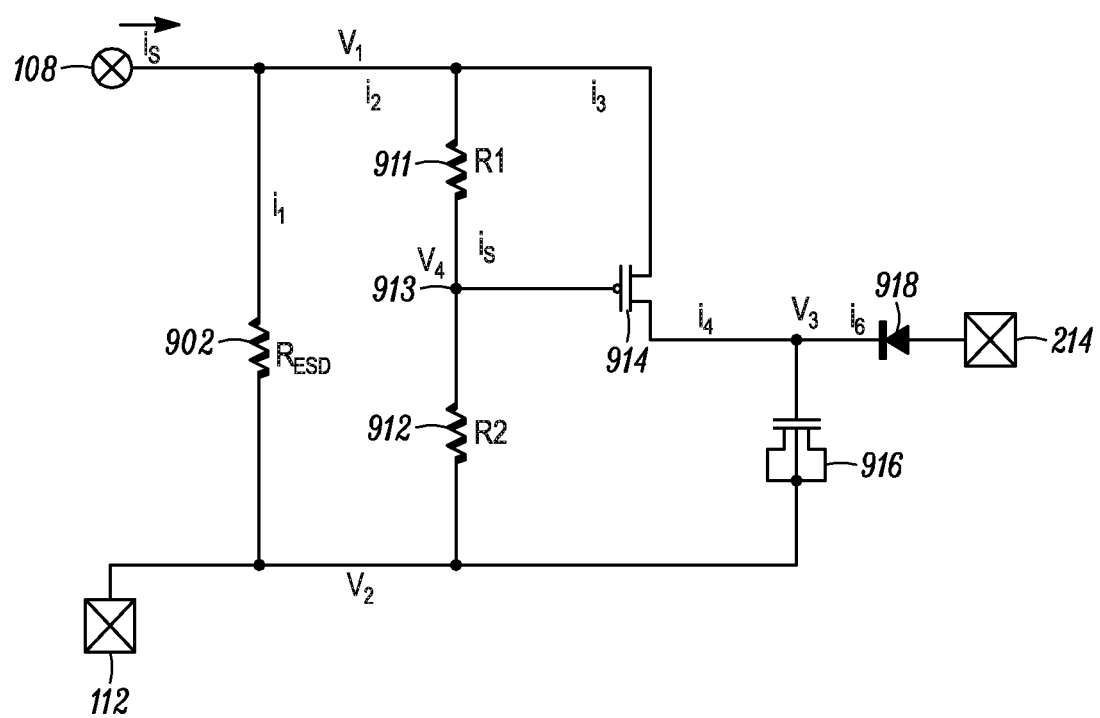
FIG. 9 is a schematic of a gate oxide-based ESD detector circuit that can be used as the ESD detector circuit shown as a block in FIG. 1.

There are several non-NVM techniques that can characterize ESD events. One such technique uses a gate oxide (SiO$_2$) device and utilizes an extent of gate damage to detect and measure an ESD event. FIG. 9 is a schematic of a detector circuit 900 that can be used as one of the detector circuits 106 shown in FIG. 1.

The detector circuit 900 utilizes gate oxide (hereinafter "GOX") damage to a metal-oxide-semiconductor capacitor (MOSCAP) to detect an ESD event. The detector circuit 900 comprises a small resistance resistor $R_{ESD}$ 902, a voltage divider consisting of $R_1$ 911 and $R_2$ 912, a PMOS trigger device 914, a MOSCAP 916 and a diode 918. Diode 918 protects the MOSCAP 916 from an ESD event through the measure pad 214. A voltage generated by current flowing across $R_{ESD}$ is used to damage the MOSCAP 916. The PMOS trigger device 914 prevents the resistor path from contributing to leakage during measure events. During an ESD event, current across $R_{ESD}$ 902 builds a voltage large enough to damage certain gate oxide devices. $R_1$ 911, $R_2$ 912 and $R_{ESD}$ 902 are tuned so that the MOSCAP 916 is damaged above specific ESD currents. The voltage divider consisting of $R_1$ 911 and $R_2$ 912 is used to tune $V_4$ in proportion to the current caused by the ESD event. As $V_1$ increases, $V_1$-$V_4$ eventually becomes large enough to turn on the PMOS trigger device 914. This rapidly increases the voltage $V_3$ to a level causing gate oxide damage. Leakage between the measure pad 214 and the discharge pad 112 indicates that an ESD event above the device threshold has occurred. The PMOS trigger in detector circuit 900 provides a more precise response than a simple voltage divider.

A plurality of detector circuits 900, each tuned to different sensitivities, can provide a good estimate of process risk. Advantageously, the detector circuit 900 is simple to implement and use. The detector circuit 900 requires fewer control pads 215 than the detector circuits that use NVM as the detector. However, the detector circuit 900 can only be used for one ESD event because, after one ESD event, detector circuit 900 is permanently damaged. The detector circuit 900 only provides evidence that an ESD event above its design threshold occurred. The detector circuit 900 does not provide a measure of event magnitude of any ESD event.

The detector circuit 900 has a large robust primary ESD path to safely conduct most of the current ($i_1$) generated during an ESD event. The MOSCAP 916 is connected in parallel to the ESD path. Adjustment of the resistance of the ESD path and the resistance of the MOSCAP 916 allow a designer to tune a peak voltage and current experienced by MOSCAP 916 during ESD events.

The resistors $R_1$ 911, $R_2$ 912 and $R_{ESD}$ 902 are tuned so that an ESD event larger than a desired threshold produces a voltage $V_3$ large enough to damage MOSCAP 916. The detector circuit 900 uses the PMOS trigger device 914 to isolate the MOSCAP 916 from voltages generated during small ESD events. The PMOS trigger device 914 is controlled by tying its gate to a middle node 913 of the voltage divider. When a sufficiently high voltage appears at $V_1$, $V_1$-$V_4$ becomes large enough to turn on PMOS trigger device 914. Most of the voltage $V_1$ is then passed to the MOSCAP 916 creating a damaging potential across its GOX. The detector circuit 900 is measured by applying a potential between the measure pad 214 and the discharge pad 112. In this configuration, a turned-off PMOS trigger device 914 blocks current from bypassing MOSCAP 916. Thus, higher than typical current indicates GOX damage. All instances of detector circuit 900 on the integrated circuit 104 share a common collector. The MOSCAP 916 is in an Isolated Pwell (IPW). Without the IPW, charge could travel from the collector 108 through the substrate and the MOSCAP body ties directly to the discharge pad 112, thereby bypassing the MOSCAP 916. Care must be taken with regards to isolation from the collector of all substrate connections, both N+ and P+, within the detector circuit 900; otherwise, ESD events could bypass the MOSCAP 916. During reverse current events, there is a foreword biased parasitic diode between the IPW and the Nwell (NW) surrounding it. This diode could result in a low resistance path between the collector 108 and discharge pad 112. High current on this path could damage the detector circuit 900. In some embodiments (not shown), ESD protection devices are included in the detector circuit 900 to safely discharge negative events through a more robust path.

Figure 10:
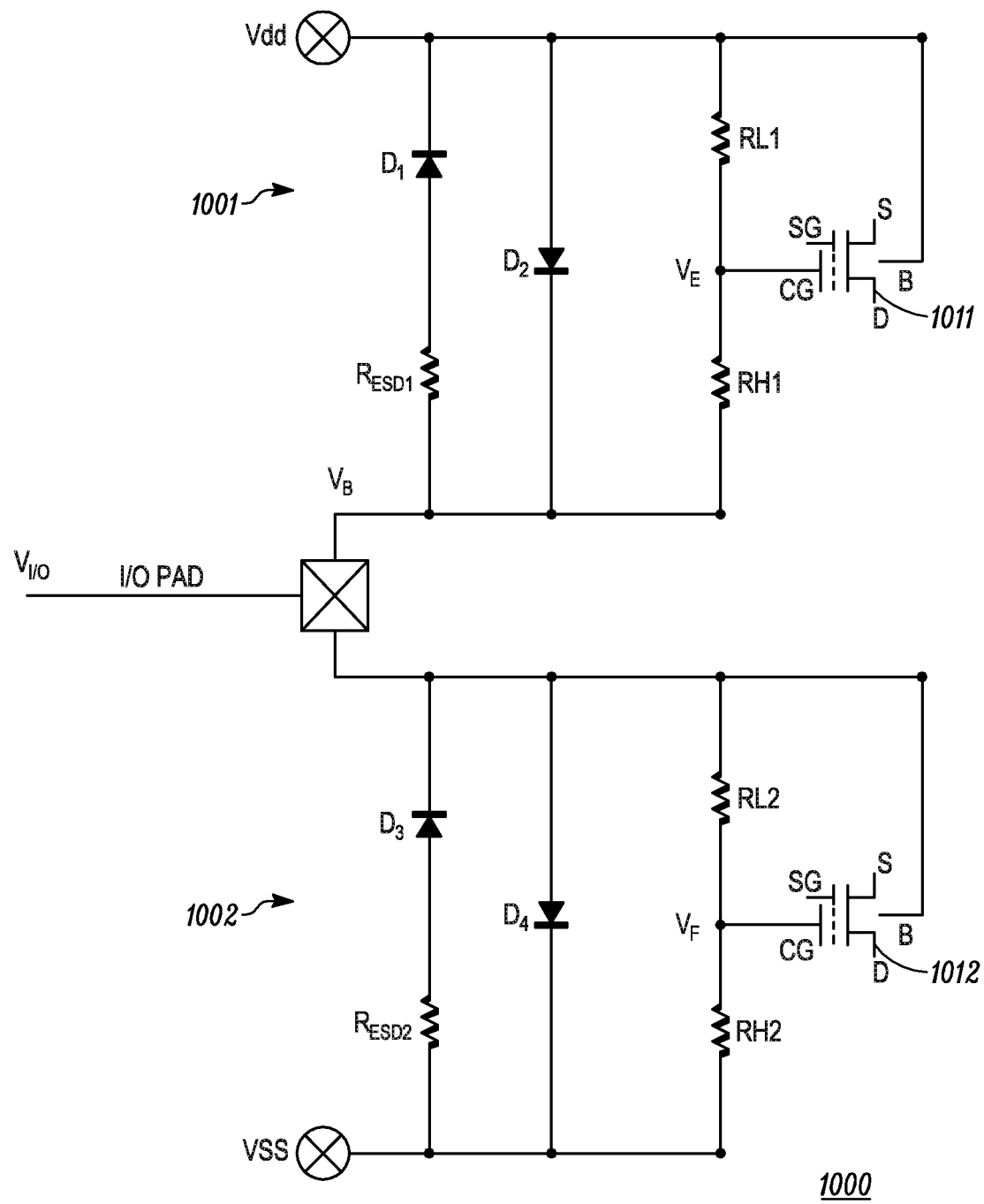
FIG. 10 is a schematic of an ESD detector circuit that can be used with another circuit.

It is possible to include an NVM-based ESD detector circuit with other circuits. FIG. 10 is a schematic of an implementation of an ESD detector circuit 1000 that uses TFS bitcells for use with another circuit (not shown).

An ESD detector circuit in the input/output (I/O) of a product can be used to indicate when an environment is providing stress to the product. An ESD detector circuit can also be used to monitor transient spikes in currents within a product during testing or operation. FIG. 10 shows one embodiment of an ESD detector circuit 1000 within the I/O circuitry of a circuit. The ESD detector circuit 1000 includes a first detector sub-circuit 1001 and a second detector sub-circuit 1002. In this example, current flowing from the I/O pad to $V_{DD}$ affects a first TFS bitcell 1011 and current flowing from $V_{SS}$ to the I/O pad affects a second TFS bitcell 1012. The operation of the first detector sub-circuit 1001 and the second detector sub-circuit 1002 is similar to the operation of the advanced detector circuit 500; therefore, a detailed description of operation of the ESD detector circuit 1000 will not be repeated here.

A method in accordance with the invention uses a TFS bitcell, such as TFS bitcell 506, response to a voltage pulse much shorter than a voltage pulse typically used to program and erase flash memory. The inventors have determined that a previously programmed TFS bitcell responds to very short, high voltage erase attempts with a predictable $V_T$ shift. To shift $V_T$ within the TFS bitcell, the method uses voltages that are significantly higher than those practically producible on most flash chips. With the method, it is not necessary to fully program or to fully erase the TFS bitcell. If an ESD event occurs, it is possible that the TFS bitcell is in a state that is between being fully programmed and fully erased. However, such state is useful when the TFS bitcell is used as a detector or meter.

The method starts with programming the test package 100 with analog direct current (DC) tests using automated test equipment (ATE). Each TFS bitcell of the test package 100 is fully programmed using an ATE tester, and the $V_T$ of each TFS bitcell is measured. The $V_T$ of the TFS bitcell is measured by sweeping voltage on a measure pad connected to the gate while measuring a source-to-drain current at a particular drain voltage. The method may, instead, start with measuring the source-to-drain current under a specific condition that is known to correlates well with $V_T$.

One or more test packages 100 are run through a manufacturing process, such as final test handling, in a same manner as ordinary production parts would be run through the manufacturing process.

If an ESD event occurs, the ESD event shifts the $V_T$ of the TFS bitcell by FN tunneling.

After the test packages 100 have passed through the production process, they are measured. After the test packages 100 are run through a production process, the $V_T$ of the TFS bitcell is measured by sweeping voltage on the measure pad 214 connected to the gate of the TFS bitcell while measuring a source-to-drain current of the TFS bitcell at a particular drain voltage. An ATE tester is used to measure the $V_T$ of each TFS bitcell of the test package 100. The $V_T$ of each bitcell before the test package 100 is run through the production process is compared to the $V_T$ of each bitcell after the test package is run through the production process. Shifts in the $V_T$ indicate ESD stress experienced during the production process. Because the TFS bitcells can record a magnitude of ESD events, a relatively small number of test packages 100 are needed to determine the distribution of ESD events for the production process.

The detector circuit 300, the advanced detector circuit 500, the three-stage detector circuit 600, the bi-directional circuit 800, the detector circuit 900 and the ESD detector circuit 1000 are not limited to detecting an electric pulse caused by an electrostatic discharge, but can also detect, measure and record a voltage magnitude of any short duration electric pulse regardless of cause.

The term "coupled", as used herein, is defined as "connected", and encompasses the coupling of devices that may be physically, electrically or communicatively connected, although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. An electrostatic discharge measuring device (hereinafter, "ESD measuring device"), comprising:
    a circuit-supporting substrate;
    a collector disposed on the circuit-supporting substrate;
    at least one discharge pad disposed on the circuit-supporting substrate; and
    at least one electrostatic discharge detector circuit (hereinafter, "ESD detector circuit") disposed on the circuit-supporting substrate and coupled to the collector and to the at least one discharge pad,
    wherein each of the at least one ESD detector circuit includes at least one device for characterizing an electrostatic discharge, and
    wherein the at least one device for characterizing an electrostatic discharge detects occurrence of an electrostatic discharge between the collector and the at least one discharge pad and records a magnitude of the electrostatic discharge between the collector and the at least one a discharge pad, wherein the magnitude of the electrostatic discharge is proportional to a difference between a voltage threshold of the at least one device for characterizing an electrostatic discharge prior to the electrostatic discharge and a voltage threshold of the at least one device for characterizing an electrostatic discharge subsequent to the electrostatic discharge.

2. The ESD measuring device of claim 1, including a low resistance path, disposed on the circuit-supporting substrate, coupled between the collector and the at least one discharge pad for generating a voltage $V_A$ caused by an electrostatic discharge.

3. The ESD measuring device of claim 2, including a voltage divider, disposed on the circuit-supporting substrate, coupled between the collector and the at least one discharge pad to produce, at an intermediate node, an intermediate voltage generated from $V_A$, wherein the intermediate voltage is proportional to $V_A$.

4. The ESD measuring device of claim 3, in which the device for characterizing an electrostatic discharge is a metal-oxide-semiconductor capacitor (hereinafter, "MOSCAP") having a first terminal coupled to the collector and having a second terminal coupled to the at least one discharge pad.

5. The ESD measuring device of claim 4, in which the MOSCAP has the first terminal coupled to the collector through a trigger transistor, disposed on the circuit-supporting substrate, that has one conductive terminal coupled to the collector, another conductive terminal coupled to the first terminal of the MOSCAP and a control terminal coupled to the intermediate node, and in which a magnitude of the electrostatic discharge is proportional to gate oxide damage of the MOSCAP.

6. The ESD measuring device of claim 5, in which the ESD detector circuit includes a measure pad, disposed on the circuit-supporting substrate, coupled to the first terminal of the ESD detector, and in which the magnitude of the electrostatic discharge that occurred between the collector and the at least one discharge pad is proportional to amount of current that flows between the measure pad and the at least one discharge pad when a predetermined potential is applied between the measure pad and the at least one discharge pad.

7. The ESD measuring device of claim 3, in which the ESD measuring device is re-useable, and in which the device for characterizing an electrostatic discharge is a non-volatile memory device.

8. The ESD measuring device of claim 7, in which the non-volatile memory device is a thin film storage bitcell.

9. The ESD measuring device of claim 8, including a drain pad, a source pad, a select gate pad and a control gate pad disposed on the circuit-supporting substrate, and in which the thin film storage bitcell has a body connected to the at least one discharge pad, a drain terminal coupled to the drain pad, a source terminal coupled to the source pad, a select gate terminal coupled to the select gate pad and a control gate terminal coupled to the intermediate node.

10. The ESD measuring device of claim 9, in which the intermediate voltage controls sensitivity of the thin film storage bitcell.

11. The ESD measuring device of claim 10, in which a magnitude of the electrostatic discharge that occurred between the collector and the at least one discharge pad is proportional a difference between a voltage threshold of the thin film storage bitcell prior to the electrostatic discharge and a voltage threshold of the thin film storage bitcell subsequent to the electrostatic discharge.

12. A microelectronic package, comprising:
    a case having a plurality of external electrical contacts; and
    an integrated circuit encapsulated in the case, the integrated circuit including:
    a collector near a center of the integrated circuit, a plurality of electrostatic discharge detector circuits (hereinafter, "ESD detector circuits"), each ESD detector circuit of the plurality of ESD detector circuits coupled to the collector, a plurality of discharge pads near a periphery of the integrated circuit, each discharge pad coupled to at least one ESD detector circuit and to at least one external electrical contact, and a plurality of measure pads, each measure pad coupled to one ESD detector circuit and to one external electrical contact, wherein each ESD detector circuit includes at least one device for characterizing an electrostatic discharge, and wherein the at least one device for characterizing an electrostatic discharge detects occurrence of an electrostatic discharge between the collector and the at least one external electrical contact that is coupled to the at least one ESD detector circuit and records magnitude of the electrostatic discharge between the collector and the at least one external electrical contact that is coupled to the at least one ESD detector circuit, and the at least one device for characterizing an electrostatic discharge is a metal-oxide-semiconductor capacitor (hereinafter, "MOSCAP") that has one terminal coupled to the collector and another terminal coupled to at least one discharge pad, and in which a magnitude of the electrostatic discharge is proportional to gate oxide damage of the MOSCAP.

13. The microelectronic package of claim 12, in which the integrated circuit includes a low resistance path, coupled between the collector and the at least one discharge pad, for generating a voltage $V_A$ caused by an electrostatic discharge.

14. The microelectronic package of claim 13, in which the microelectronic package is re-useable, and in which the device for characterizing an electrostatic discharge is a thin film storage bitcell.

15. The microelectronic package of claim 14, in which the integrated circuit includes a drain pad, a source pad, a select gate pad and a control gate pad, and in which the thin film storage bitcell has a body connected to the at least one discharge pad, a drain terminal coupled to the drain pad, a source terminal coupled to the source pad, a select gate terminal coupled to the select gate pad and a control gate terminal coupled to a node having a voltage representative of a voltage of an electrostatic discharge.

16. The microelectronic package of claim 15, in which the magnitude of the electrostatic discharge that occurred between the collector and a discharge pad that is coupled to an ESD detector circuit is proportional to a difference between a voltage threshold of the thin film storage bitcell prior to the electrostatic discharge and a voltage threshold of the thin film storage bitcell subsequent to the electrostatic discharge.

17. A method of determining location of occurrence of an electrostatic discharge on a production microelectronic package during a manufacturing process, comprising:

providing a test microelectronic package externally equivalent to a production microelectronic package, the test microelectronic package having a plurality of external electrical contacts, the test microelectronic package housing an integrated circuit including an electrically conductive collector coupled to a plurality of electrostatic discharge detector circuits (hereinafter, "ESD detector circuits"), each ESD detector circuit coupled to a different external electrical contact, each ESD detector circuit including a thin film storage bitcell (hereinafter, "TFS bitcell");

programming each TFS bitcell of each ESD detector circuit;

after programming, measuring a voltage threshold of each TFS bitcell of each ESD detector circuit;

after measuring, running the test microelectronic package through a manufacturing process in a same manner as a production microelectronic package would be run through the manufacturing process;

after running the test microelectronic package through the manufacturing process, measuring the voltage threshold of each TFS bitcell of each ESD detector circuit;

determining whether an electrostatic discharge occurred based a change in the voltage threshold of each TFS bitcell;

determining a magnitude of the electrostatic discharge based on an amount of the change;

determining the external electrical contact at which the electrostatic discharge occurred based on which ESD detector circuit includes the TFS bitcell at which the change in voltage threshold occurred; and determining location occurrence of the electrostatic discharge on the production microelectronic package during the manufacturing process based the external electrical contact of the test microelectronic package at which the electrostatic discharge occurred.

18. The method of claim 17, in which the steps of measuring the voltage threshold of each TFS bitcell before and after running the test microelectronic package through the manufacturing process includes the step of using automated test equipment to sweep voltage on an external electrical contact coupled to a gate of the TFS bitcell while measuring a source-to-drain current of the TFS bitcell at a predetermined drain voltage of the TFS bitcell.

19. The method of claim 17, including the step of:

re-programming each TFS bitcell with analog direct current using automated test equipment so that the test microelectronic package can be re-used.

* * * * *